(12) United States Patent
Yen et al.

(10) Patent No.: US 12,130,555 B2
(45) Date of Patent: *Oct. 29, 2024

(54) METHOD AND APPARATUS FOR MITIGATING CONTAMINATION

(71) Applicant: TAIWAN SEMICONDUCTOR MANUFACTURING COMPANY, LTD., Hsinchu (TW)

(72) Inventors: Chih-Ping Yen, Hsinchu (TW); Yen-Shuo Su, Hsinchu (TW); Chieh Hsieh, Taoyuan (TW); Shang-Chieh Chien, New Taipei (TW); Chun-Lin Chang, Zhubei (TW); Li-Jui Chen, Hsinchu (TW); Heng-Hsin Liu, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/142,500

(22) Filed: May 2, 2023

(65) Prior Publication Data

US 2023/0273525 A1 Aug. 31, 2023

Related U.S. Application Data

(63) Continuation of application No. 17/460,121, filed on Aug. 27, 2021, now Pat. No. 11,675,272.

(51) Int. Cl.
*G03F 7/00* (2006.01)
*H05G 2/00* (2006.01)

(52) U.S. Cl.
CPC .......... *G03F 7/70033* (2013.01); *H05G 2/006* (2013.01); *H05G 2/008* (2013.01)

(58) Field of Classification Search
CPC ..... G03F 7/70033; H05G 2/006; H05G 2/008
See application file for complete search history.

(56) References Cited

U.S. PATENT DOCUMENTS

| 11,675,272 B2* | 6/2023 | Yen ......................... H05G 2/006 |
| | | 250/492.2 |
| 2020/0089124 A1 | 3/2020 | Labetski et al. |

OTHER PUBLICATIONS

Notice of Allowance issued in U.S. Appl. No. 17/460,121, dated Feb. 2, 2023.
Non-Final Office issued in U.S. Appl. No. 17/460,121, dated Oct. 20, 2022.

* cited by examiner

*Primary Examiner* — Nicole M Ippolito
*Assistant Examiner* — Hanway Chang
(74) *Attorney, Agent, or Firm* — STUDEBAKER & BRACKETT PC

(57) ABSTRACT

An extreme ultra violet (EUV) lithography method includes receiving an EUV light by a scanner from an EUV light source, the EUV light passing through an intermediate focus disposed in the scanner and at a junction of the EUV light source and the scanner; directing the EUV light by the scanner to a reticle in the scanner; and deflecting nanoparticles from the EUV light source away from the reticle by generating a gas flow using a gas jet disposed entirely in the scanner and proximate to an interface of the scanner and the intermediate focus such that the gas jet does not block the EUV light.

20 Claims, 9 Drawing Sheets

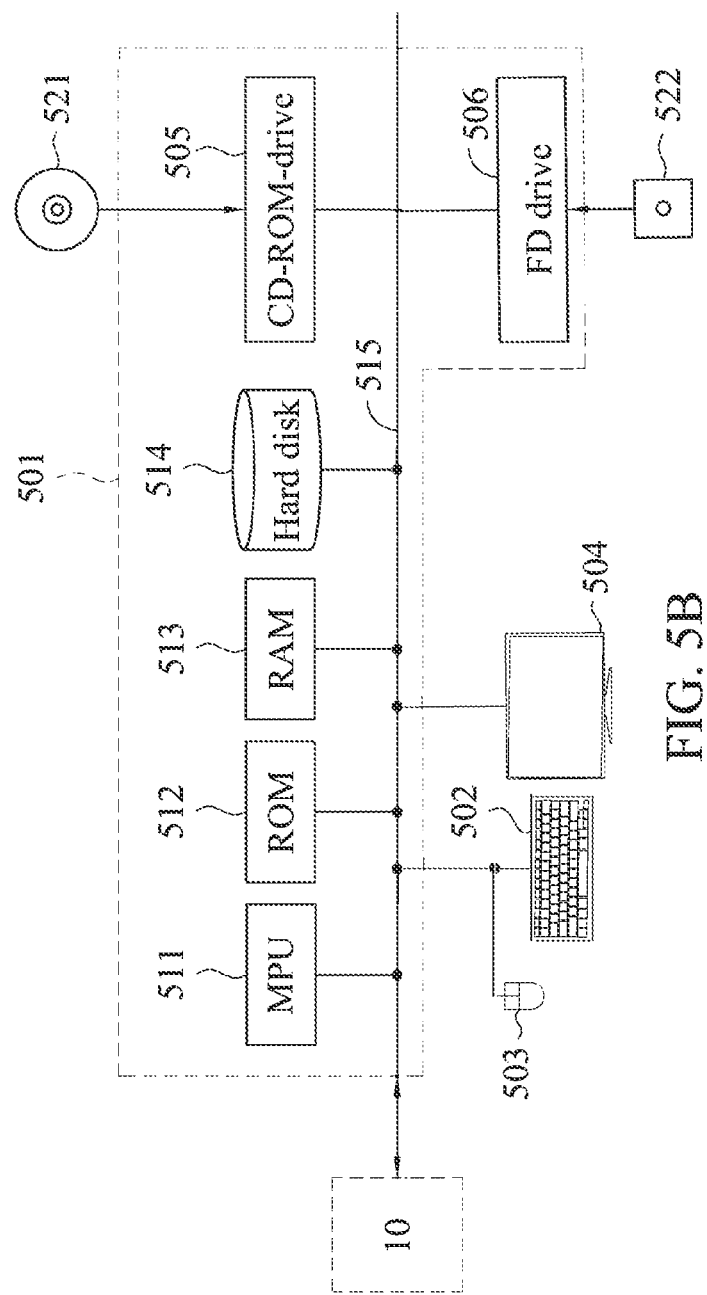
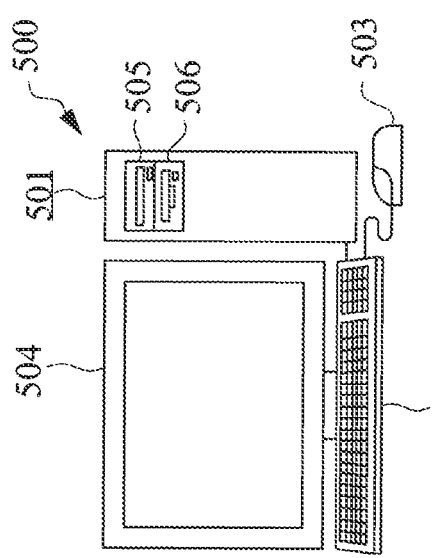
FIG. 5A
FIG. 5B

METHOD AND APPARATUS FOR MITIGATING CONTAMINATION

PRIORITY CLAIM AND CROSS-REFERENCE

This application is a continuation of U.S. patent application Ser. No. 17/460,121 filed on Aug. 27, 2021, entitled "Method and Apparatus for Mitigating Contamination," the entire disclosure of which is incorporated herein by reference.

BACKGROUND

One growing technique for semiconductor manufacturing is extreme ultraviolet (EUV) lithography. EUV employs scanners using light in the EUV spectrum of electromagnetic radiation, including wavelengths from about one nanometer (nm) to about one hundred nm. Many EUV scanners still utilize projection printing, similar to various earlier optical scanners, except EUV scanners accomplish it with reflective rather than refractive optics, that is, with mirrors instead of lenses.

EUV lithography employs a laser-produced plasma (LPP), which emits EUV light. The LPP is produced by focusing a high-power laser beam, from a carbon dioxide ($CO_2$) laser and the like, onto small fuel droplet targets of tin (Sn) in order to transition it into a highly-ionized plasma state. This LPP emits EUV light with a peak maximum emission of about 13.5 nm or smaller. The EUV light is then collected by a collector and reflected by optics towards a lithography exposure object, such as a semiconductor wafer. Tin debris is generated in the process, which debris can adversely affect the performance and efficiency of the EUV apparatus.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 5A and FIG. 5B are diagrams of a controller in accordance with some embodiments.

DETAILED DESCRIPTION

Figure 1A:
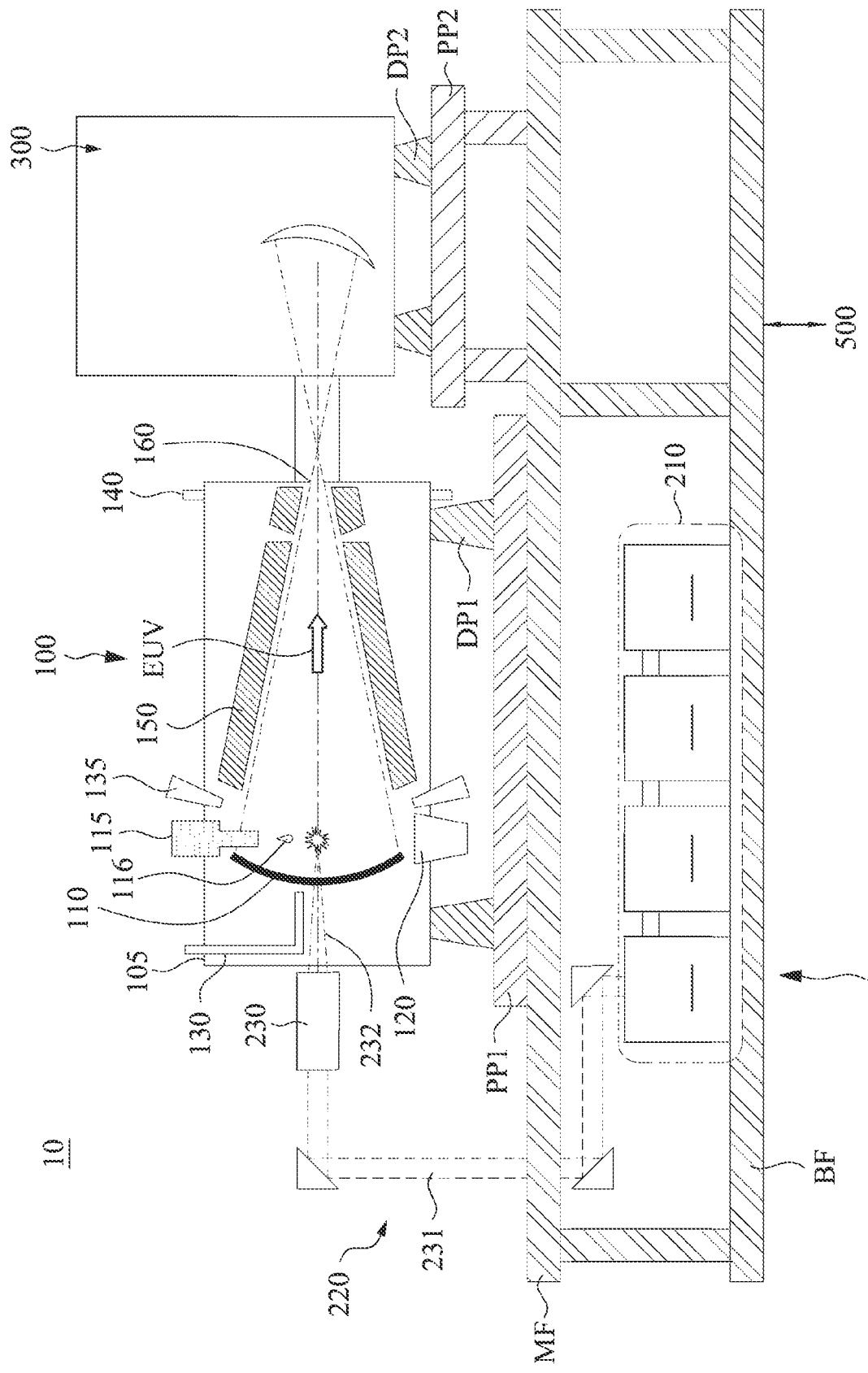
FIG. 1A is a diagram of a lithography apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multilayer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In the present disclosure, the terms mask, photomask, and reticle are used interchangeably. In the present embodiment, the mask is a reflective mask. One embodiment of the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform various lithography exposing processes. The lithography system may further include other modules or be integrated with (or be coupled with) other modules.

A lithography system is essentially a light projection system. Light is projected through a 'mask' or 'reticle' that constitutes a blueprint of the pattern that will be printed on a workpiece. The blueprint is four times larger than the intended pattern on the wafer or chip. With the pattern encoded in the light, the system's optics shrink and focus the pattern onto a silicon wafer coated with a photoresist. After the pattern is printed, the system moves the wafer slightly and makes another copy on the wafer. This process is repeated until the wafer is covered in patterns, completing one layer of the eventual semiconductor device. To make an entire microchip, this process will be repeated one hundred times or more, laying patterns on top of patterns. The size of the features to be printed varies depending on the layer, which means that different types of lithography systems are used for different layers, from the latest-generation EUV systems for the smallest features to older deep ultraviolet (DUV) systems for the largest.

FIG. 1A is a schematic and diagrammatic view of an EUV lithography system 10. The EUV lithography system 10 includes an EUV radiation source apparatus 100 (sometimes referred to herein as a "source side" in reference to it or one or more of its relevant parts) to generate EUV light, an exposure tool 300, such as a scanner, and an excitation laser source apparatus 200. As shown in FIG. 1A, in some embodiments, the EUV radiation source apparatus 100 and the exposure tool 300 are installed on a main floor (MF) of a clean room, while the excitation laser source apparatus 200 is installed in a base floor (BF) located under the main floor. Each of the EUV radiation source apparatus 100 and the exposure tool 300 are placed over pedestal plates PP1 and PP2 via dampers DP1 and DP2, respectively. The EUV radiation source apparatus 100 and the exposure tool 300 are coupled to each other by a coupling mechanism, which may include a focusing unit (not shown).

The EUV lithography system 10 is designed to expose a resist layer to EUV light (or EUV radiation). The resist layer is a material sensitive to the EUV light. The EUV lithography system 10 employs the EUV radiation source apparatus 100 to generate EUV light having a wavelength ranging between about 1 nanometer (nm) and about 100 nm. In one particular example, the EUV radiation source apparatus 100 generates EUV light with a wavelength centered at about 13.5 nm. In various embodiments, the EUV radiation source apparatus 100 utilizes LPP to generate the EUV radiation.

As shown in FIG. 1A, the EUV radiation source apparatus 100 includes a target droplet generator 115 and an LPP collector 110, enclosed by a chamber 105. The target droplet generator 115 generates a plurality of target droplets 116. In some embodiments, the target droplets 116 are tin (Sn) droplets. In some embodiments, the target droplets 116 have a diameter of about 30 microns ($\mu$m). In some embodiments, the target droplets 116 are generated at a rate about fifty droplets per second and are introduced into an excitation zone 106 at a speed of about seventy meters per second (m/s or mps). Other material can also be used for the target droplets 116, for example, a liquid material such as a eutectic alloy containing Sn and lithium (Li).

As the target droplets 116 move through the excitation zone 106, pre-pulses (not shown) of the laser light first heat the target droplets 116 and transform them into lower-density target plumes. Then, the main pulse 232 of laser light is directed through windows or lenses (not shown) into the excitation zone 106 to transform the target plumes into an LLP. The windows or lenses are composed of a suitable material substantially transparent to the pre-pulses and the main pulse 232 of the laser. The generation of the pre-pulses and the main pulse 232 is synchronized with the generation of the target droplets 116. In various embodiments, the pre-heat laser pulses have a spot size about 100 $\mu$m or less, and the main laser pulses have a spot size about 200-300 $\mu$m. A delay between the pre-pulse and the main pulse 232 is controlled to allow the target plume to form and to expand to an optimal size and geometry. When the main pulse 232 heats the target plume, a high-temperature LPP is generated. The LPP emits EUV radiation, which is collected by one or more mirrors of the LPP collector 110. More particularly, the LPP collector 110 has a reflection surface that reflects and focuses the EUV radiation for the lithography exposing processes. In some embodiments, a droplet catcher 120 is installed opposite the target droplet generator 115. The droplet catcher 120 is used for catching excess target droplets 116 for example, when one or more target droplets 116 are purposely or otherwise missed by the pre-pulses or main pulse 232.

The LPP collector 110 includes a proper coating material and shape to function as a mirror for EUV collection, reflection, and focusing. In some embodiments, the LPP collector 110 is designed to have an ellipsoidal geometry. In some embodiments, the coating material of the collector 110 is similar to the reflective multilayer of an EUV mask. In some examples, the coating material of the LPP collector 110 includes multiple layers, such as a plurality of molybdenum/silicon (Mo/Si) film pairs, and may further include a capping layer (such as ruthenium (Ru)) coated on the multiple layers to substantially reflect the EUV light.

The main pulse 232 is generated by the excitation laser source apparatus 200. In some embodiments, the excitation laser source apparatus 200 includes a pre-heat laser and a main laser. The pre-heat laser generates the pre-pulse that is used to heat or pre-heat the target droplet 116 in order to create a low-density target plume, which is subsequently heated (or reheated) by the main pulse 232, thereby generating increased emission of EUV light.

The excitation laser source apparatus 200 may include a laser generator 210, laser guide optics 220 and a focusing apparatus 230. In some embodiments, the laser generator 210 includes a carbon dioxide (CO2) laser source or a neodymium-doped yttrium aluminum garnet (Nd:YAG) laser source. The laser light 231 generated by the laser generator 210 is guided by the laser guide optics 220 and focused into the main pulse 232 of the excitation laser by the focusing apparatus 230, and then introduced into the EUV radiation source apparatus 100 through one or more apertures, such as the aforementioned windows or lenses.

In such an EUV radiation source apparatus 100, the LPP generated by the main pulse 232 creates physical debris, such as ions, gases and atoms of the droplet 116, along with the desired EUV light. In operation of the lithography system 10, there is an accumulation of such debris on the LPP collector 110, and such physical debris exits the chamber 105 and enters the exposure tool 300 (scanner side) as well as the excitation laser source apparatus 200.

In various embodiments, a buffer gas is supplied from a first buffer gas supply 130 through the aperture in the LPP collector 110 by which the main pulse 232 of laser light is delivered to the tin droplets 116. In some embodiments, the buffer gas is hydrogen (H2), helium (He), argon (Ar), nitrogen (N2), or another inert gas. In certain embodiments, H2 is used, since H radicals generated by ionization of the buffer gas can also be used for cleaning purposes. The buffer gas can also be provided through one or more second buffer gas supplies 135 toward the LPP collector 110 and/or around the edges of the LPP collector 110. Further, and as described in more detail later below, the chamber 105 includes one or more gas outlets 140 so that the buffer gas is exhausted outside the chamber 105.

Hydrogen gas has low absorption of the EUV radiation. Hydrogen gas reaching to the coating surface of the LPP collector 110 reacts chemically with a metal of the target droplet 116, thus forming a hydride, e.g., metal hydride. When Sn is used as the target droplet 116, stannane (SnH4), which is a gaseous byproduct of the EUV generation process, is formed. The gaseous SnH4 is then pumped out through the outlet 140. However, it is difficult to exhaust all gaseous SnH4 from the chamber and to prevent the Sn debris and SnH4 from entering the exposure tool 300 and the excitation laser source apparatus 200. To trap the Sn, SnH4 or other debris, one or more debris collection mechanisms or devices 150 are employed in the chamber 105. In various embodiments, a controller 500 controls the EUV lithography system 10 and/or one or more of its components shown in and described above with respect to FIG. 1A.

Figure 1B:
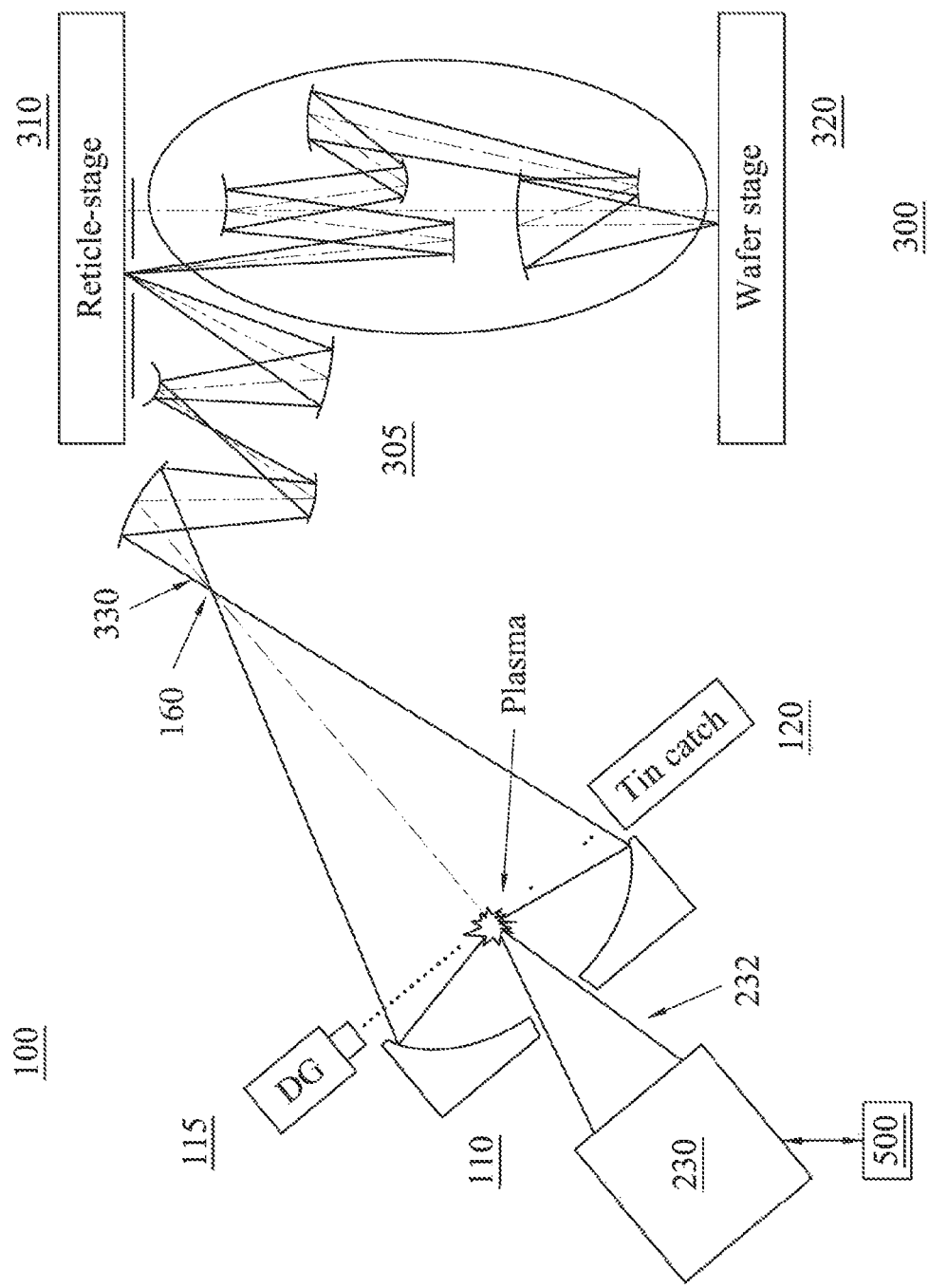
FIG. 1B and FIG. 1C are diagrams of laser and optics components in accordance with some embodiments.

As shown in FIG. 1B, the exposure tool 300 (sometimes referred to herein as the "scanner side" in reference to it or one or more of its relevant parts) includes various reflective optic components, such as convex/concave/flat mirrors, a mask holding mechanism 310 including a mask stage (i.e., a reticle stage), and wafer holding mechanism 320 (i.e., a wafer stage). The EUV radiation generated by the EUV radiation source apparatus 100 and focused at intermediate focus 160 is guided by the reflective optical components 305 onto a mask (not shown) secured on the reticle stage 310, also referenced as a mask stage herein. In some embodiments, the distance from the intermediate focus 160 and the reticle disposed in the scanner side is approximately 2 meters. In some embodiments, the reticle size is approximately 152 mm by 152 mm. In some embodiments, the reticle stage 310 includes an electrostatic chuck, or 'e-chuck,' (not shown) to secure the mask. The EUV light patterned by the mask is used to process a wafer supported on wafer stage 320. Because gas molecules absorb EUV light, the chambers and areas of the lithography system 10 used for EUV lithography patterning are maintained in a vacuum or a low-pressure environment to avoid EUV intensity loss. In various embodiments, the controller 500 controls one or more of the components of the EUV lithography system 10 as shown in and described with respect to FIG. 1B.

Figure 1C:
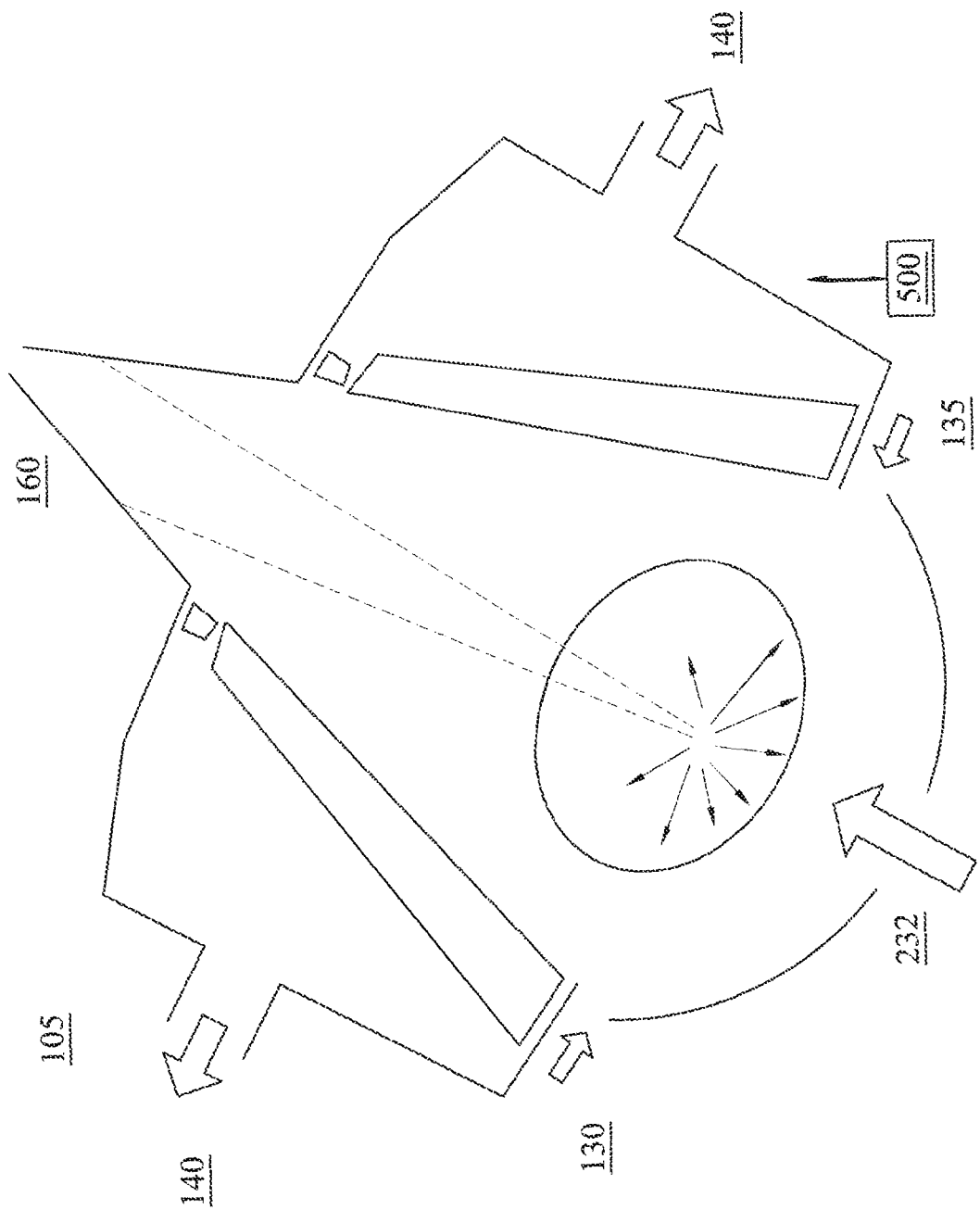

FIG. 1C shows further detail of the chamber 105 of the EUV radiation source apparatus 100, in which the relation of the LPP collector 110, the buffer gas supply 130, the second buffer gas supply 135, the gas outlet ports 140 and the intermediate focus 160 are illustrated. The main pulse 232 of the laser light is directed through the LPP collector 110 to the excitation zone 106 where it irradiates a target plume to form an LPP. The LPP emits EUV light that is collected by the LPP collector 110 and then directed through the intermediate focus 160 toward the exposure tool 300 for use in patterning a wafer as described previously. In various embodiments, the controller 500 controls one or more of the components of the EUV lithography system 10 as shown in and described with respect to FIG. 1C.

In various embodiments of the EUV lithography system 10, pressure in the source side is higher than pressure in the scanner side. This is because the source side uses hydrogen gas to force the removal of airborne Sn debris therefrom, while the scanner side is maintained in near vacuum in order to avoid diminishing strength of the EUV light (being absorbed by air molecules) or interfering with the semiconductor manufacturing operations performed therein. In various embodiments, the intermediate focus 160 is disposed at a junction point or intersection of the source side and the scanner side. As EUV light or radiation is generated, at least 50% of the mass of each tin droplet used to form the LPP does not vaporize, but instead becomes numerous tin nanoparticles ranging in diameter from 30 nm to 100 nm. Detrimentally, the nanoparticles also flow from the source side to scanner side through the intermediate focus 160 in the same general direction as the light generated by the source side. Due to the pressure differential between the source side and the scanner side, these nanoparticles attain high momenta. The momenta of the Sn nanoparticles entering the intermediate focus 160 are very large. With speeds and velocities of 100 m/s or more, such nanoparticles attain nominal momenta of approximately $3.67*10^{-16}$ m*kg/s. In some embodiments, nanoparticles that migrate to the scanner side due to the pressure difference fall on the reticle and wafer, thereby detrimentally leading to a higher incidence of defects in the semiconductor manufacturing operations performed by the lithography apparatus 10.

It has been observed that there is not sufficient time to deflect Sn nanoparticles by using an electromagnetic (EM) field or the like alone. This is due to the short period of time between nanoparticle debris generation and arrival of the nanoparticles at the intermediate focus 160. The strength of any EM field must also be limited so that it does not interfere with the operation of other components of the lithography apparatus 10, which makes it ineffective alone against nanoparticle with a high momentum. However, the inventors of the present disclosure have found that tin nanoparticles can be prevented from flying onto the reticle by using high-density and high velocity gas flow to deflect such nanoparticles, either alone or in combination with a low level EM field in various embodiments.

Figure 2B:
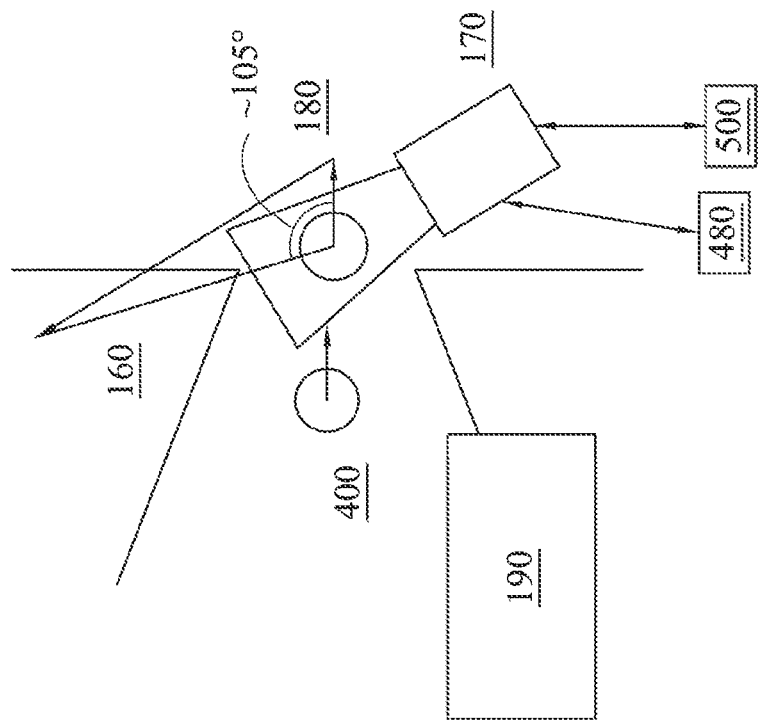
FIG. 2B is a diagram of a gas jet disposed in a second orientation in accordance with some embodiments.
Figure 2A:
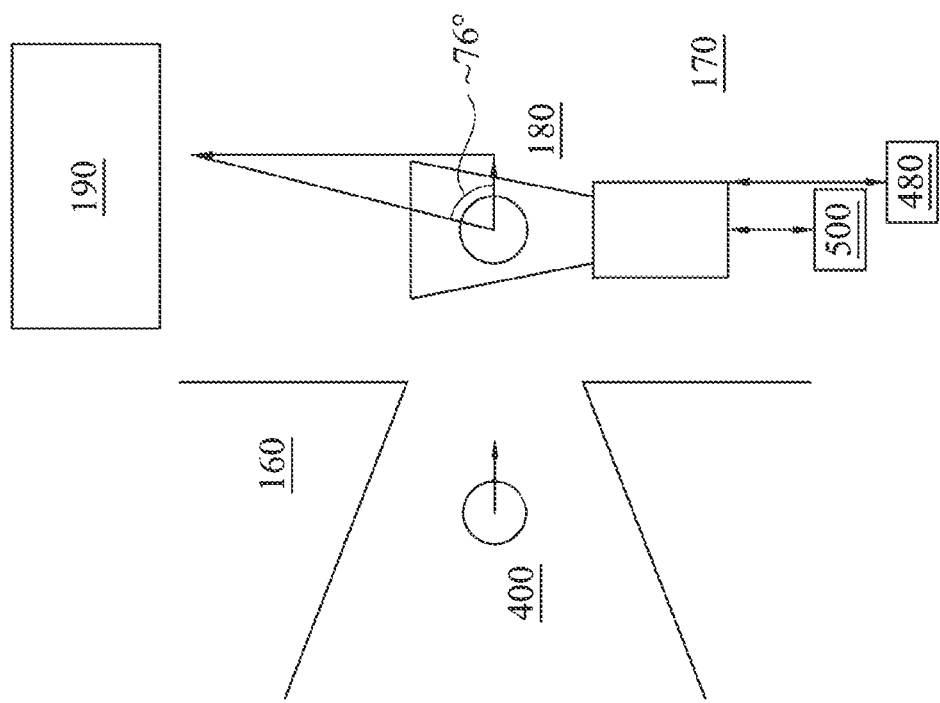
FIG. 2A is a diagram of a gas jet disposed in a first orientation in accordance with some embodiments.

FIG. 2A is a diagram of a gas jet 170 disposed in a first orientation at or near the intermediate focus 160 in accordance with some embodiments. In some embodiments, the gas jet 170 is a supersonic gas jet, which produces a gas flow 180 having velocities that can exceed supersonic velocities of 383 m/s. In some embodiments, the speed of the gas flow 180 is substantially between 300 m/s and 1200 m/s. In some embodiments, the speed of the gas flow 180 is maintained at approximately 800-1000 m/s. In some embodiments, the velocity of the gas flow 180 is fixed. In other embodiments, the velocity of the gas flow 180 is adjustable by the controller 500 or manually by an adjustment mechanism 480. In some embodiments, the adjustment mechanism 480 is a knob, such as a tuning knob, which may be manually turned or set to a desired position. In some embodiments, a motor (not shown) responds to the adjustment mechanism 480 or the controller 500 to adjust the velocity of the gas jet 170 accordingly.

As shown in FIG. 2A, nanoparticles 400 generated by the source side enter the intermediate focus 160 before impinging on the scanner side and, in various embodiments, flow in the same general direction, on average, as the general direction of the light generated by the source side, which is directed through the intermediate focus 160 toward the scanner side. In some embodiments, the gas jet 170 is disposed so that it does not block the light entering the scanner side. In various embodiments, the gas jet 170 is positioned such that the gas flow 180 is proximate to the intersection of the scanner side and the intermediate focus 160 in order to deflect nanoparticles 400 that enter the scanner side from the intermediate focus. In various embodiments, the gas jet is oriented such that the gas flow 180 is substantially perpendicular (i.e., 90±2 degrees from) the direction of the flow of the light and the nanoparticles 400 exiting the intermediate focus 160. In some embodiments, this orientation of the gas jet 170 is fixed. In other embodiments, this orientation is adjustable by up to 20 degrees in two directions, such that the gas flow 180 may be adjusted between 70 degrees and 110 degrees of the direction of the flow of the light and the nanoparticles 400.

In embodiments where the orientation of the gas jet 170 is perpendicular to the direction of the flow, the nanoparticles 400 may be deflected up to approximately 76 degrees from the direction of the flow. In various embodiments, the nanoparticles 400 are allowed to enter the scanner side but are immediately deflected away from the reticle disposed therein by the gas flow 180. In various embodiments, the nanoparticles 400 are deflected towards a debris collector 190. In some embodiments, the debris collector 190 comprises a port, a filter and a container, or the like to collect and hold the nanoparticle debris. In some embodiments, the debris collector 190 includes a vacuum chamber (not shown) for attracting the nanoparticles 400 into an interior of the debris collector 190. In some embodiments, the debris collector 190 is disposed entirely within the scanner side.

FIG. 2B is a diagram of a gas jet disposed in a second orientation in accordance with some embodiments. In some embodiments, the gas jet 170 has a fixed orientation of approximately 120 degrees (e.g., 120±5 degrees) from the direction of the flow of the nanoparticles 400. In such embodiments, the nanoparticles 400 may be deflected at approximately 105 degrees from the direction of the flow, i.e. back toward the source side. In other embodiments, this orientation is adjustable by up to 20 degrees in two directions, such that the gas flow 180 may be adjusted between 100 degrees and 140 degrees of the direction of the flow of the light and the nanoparticles 400. In some embodiments, this orientation prevents the nanoparticles 400 which have entered the intermediate focus 160 from crossing into the scanner side. In some embodiments, the nanoparticles 400 are deflected toward a debris collector 190 disposed in the source side proximate to the intermediate focus 160. In some embodiments, the outlets 140 act as the debris collector 190. In some embodiments, the nanoparticles 400 are deflected toward the debris collection mechanisms or devices 150 in the source side. In some embodiments, the gas jet 170 is disposed entirely in the scanner side, but is positioned such that at least a portion of the gas flow 180 is disposed within the intermediate focus 160. In some embodiments, the entirety of the gas flow 180 is disposed within the intermediate focus 160. In various embodiments, the orientation of the gas jet 170 may be changed between approximately 100 degrees to 140 degrees from the direction of the flow of the nanoparticles 400 entering the intermediate focus 160. In such embodiments, the orientation of the gas jet 170 may be adjusted by the adjustment mechanism 480 or the controller 500.

Figure 3B:
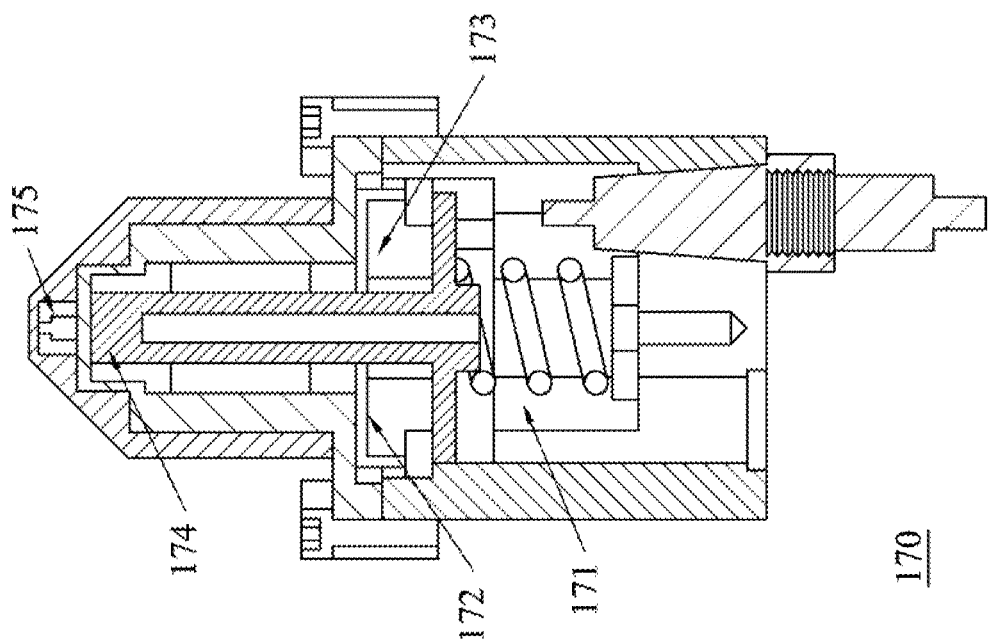
FIG. 3B is a diagram of internal components of a gas jet in accordance with some embodiments.
Figure 3A:
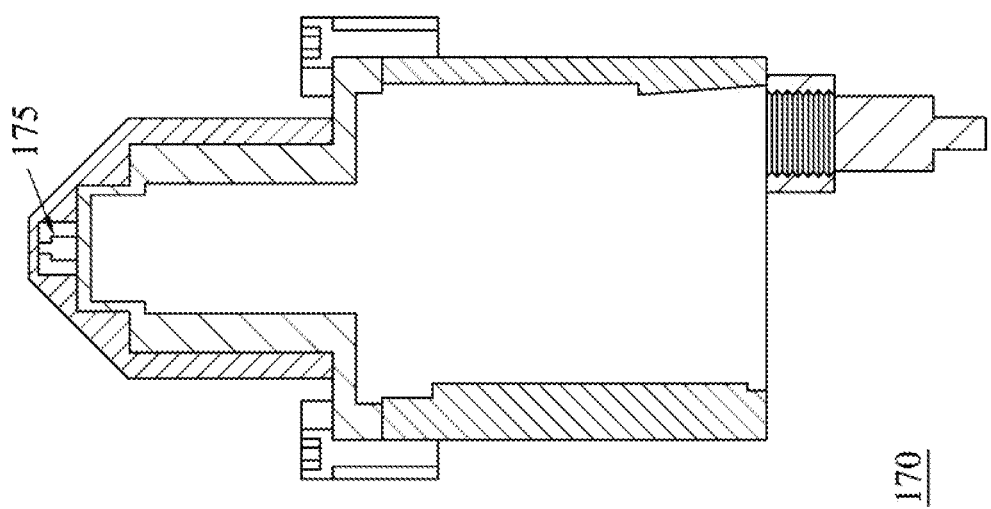
FIG. 3A is an external view of a gas jet in accordance with some embodiments.

FIG. 3A is an external view of a gas jet 170 in accordance with some embodiments. In various embodiments, the gas jet 170 is approximately 14 centimeters (cm) in length. In some embodiments, the gas jet 170 includes a nozzle 175 for generating the gas flow 180. In some embodiments, the nozzle 175 has a single opening for directing the gas flow 180. In some embodiments, the nozzle 175 includes multiple nozzles. In some embodiments, the nozzle 175 includes two or more gas jets 170. In some embodiments, the two or more gas jets 170 are arranged in series.

FIG. 3B is a diagram of internal components of a gas jet 170 in accordance with some embodiments. In some embodiments, the gas jet 170 is an ultrafast gas valve. In various embodiments, the gas jet 170 operates by driving a fast, high current (i.e., 1 kiloamp (kA)) pulse into an electromagnetic coil. An aluminum flyer plate 172 is pressed against this coil and is repelled by the eddy current induced in it. The flyer plate 172 is backed by a coil spring 171. The motion of the flyer plate 172 is comparable to a pendulum that is excited by the pulse. In various embodiments, the flyer plate 172 moves back 1 mm in 100 μs, then returns to its seat in 600 μs. In some embodiments, the flyer plate 172 has a long stub that seals against the valve face, to which the nozzle 175 is attached. This stub minimizes the volume between the valve seat 174 and the throat of nozzle 175, which allows fast rise time of the gas from the nozzle 175. FIG. 3B shows a cross-section view and photograph of the gas jet 170. The flyer plate 172 backed by a coil spring 174 and pressed up against the spiral wound coil 173. In various embodiments, the 25 mm diameter spiral coil 173 is wound from a 3 mm wide copper strip and insulated by a thin Kapton strip. In various embodiments, the flyer plate 172 has a long hollow snout that seals against a 4 mm diameter O-ring (not shown) close to the base of the nozzle 175. In some embodiments, the snout is made hollow to minimize the mass of the flyer plate 172. In various embodiments, a charge voltage of 350 V, a current of 2 kA with a 140 μs half period in the (magnetic field strength=6H) coil imparts a 0.07 newton-second (Ns) impulse to the 9 gram (g) aluminum flyer plate 172 in order to produce the supersonic gas flow 180.

In various embodiments, the gas jet 170 is coupled to a suitable supersonic nozzle 175 to create a well-defined gas flow 180. In some embodiments, two types of supersonic Laval nozzles are available to be coupled to the gas jet 170 to produce a suitable gas flow 180. The first design is a "method of characteristics" design, in which hyperbolic equations are solved to give a shock-free contour everywhere along the internal expansion of the nozzle 175. The second design is a "straight" nozzle, in which the supersonic section is a simple conical expansion from the throat to the exit of the nozzle 175. The straight nozzle design is easier to manufacture and is used in various embodiments.

Figure 4A:
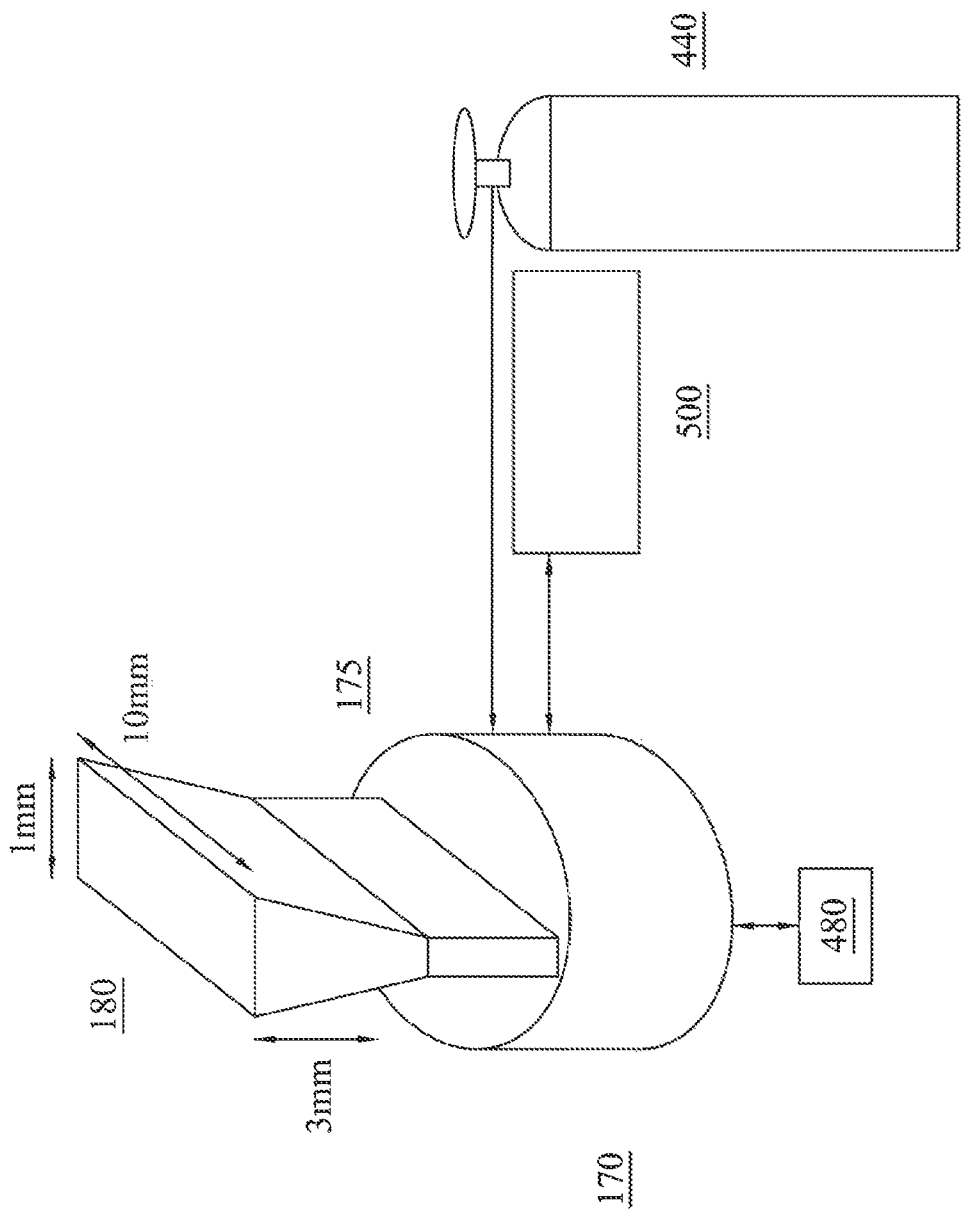
FIG. 4A is a diagram of external components used in conjunction with a gas jet in accordance with some embodiments.

FIG. 4A is a diagram of external components operating the gas jet 170 in accordance with some embodiments. The nozzle 175, gas flow 180, adjustment mechanism 480, and controller 500 operate in the manners previously described. A backing pressure supply 440 provides a gas for use by the gas jet 170 to create the gas flow 180 in various embodiments. A variety of gases may be supplied by the backing pressure supply 440 to produce the gas flow 180, such as H2, N2, He, Ar or another inert gas. In various embodiments H2 is used since it absorbs the least amount of EUV light, and thus absorbs the least light used by the semiconductor manufacturing operations performed in the scanner side of the lithography apparatus 10. Advantageously, H2 is already supplied to other components of the system 10, such as the source side, so that no major modifications need to be made to accommodate the gas jet 170 using hydrogen.

In various embodiments, the dimensions of the gas flow 180 are 10 mm in length by 1 mm in width by 3 mm in height from the nozzle 175. In some embodiments, the dimensions of the gas flow 180 are fixed. In other embodiments, one or more of the dimensions of the gas flow are adjustable. In some embodiments, the controller 500 adjusts the size of one or more dimensions of the gas flow 180. In some embodiments, the adjustment mechanism 480 is used to manually adjust one or more dimensions of the gas flow 180. In some embodiments, the length of gas flow 180 generated by the nozzle 175 which is of sufficient density to deflect the nanoparticle debris is between about 1 mm and about 20 mm. In some embodiments, the width of the gas flow 180 is between about 1 mm and about 5 mm. In some embodiments, the height of the gas flow 180 is between about 1 mm and about 10 mm. In various embodiments, the adjustment mechanism 480 or the controller 500 may be used to change one or more additional characteristics of the gas flow 180, such as the density of the gas flow 180, a backing pressure of the gas supplied by the backing pressure supply 440 and a temperature of the gas flow 180.

Figure 4B:
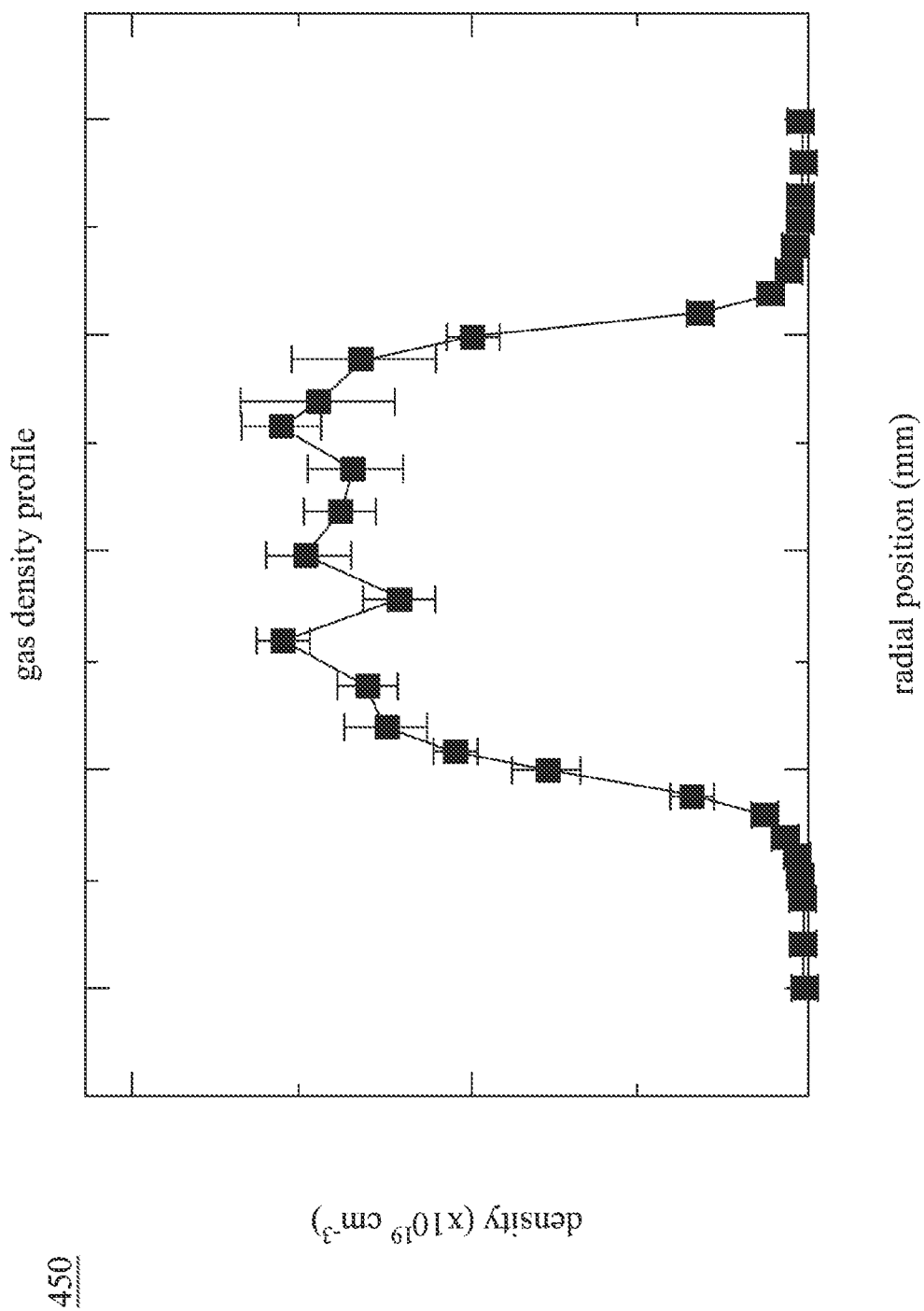
FIG. 4B is a graph of a gas profile for a gas flow in accordance with some embodiments.

FIG. 4B is a graph 450 displaying profile characteristics for the gas flow 180 produced by the gas jet 170 in accordance with some embodiments. In order to provide sufficient deflective force to counter the flow and momentum of nanoparticles 400, it has been determined that a large molecular gas density of between $10^{-18}$ and $10^{-21}$ g/cm$^3$ is useful to deflect nearly all tin debris generated on the source side, thereby preventing defects in the semiconductor manufacturing process performed in the scanner side by the lithography system 10. In some embodiments, the gas density along the length of the nozzle 175 is maintained between substantially 1.2 and 1.7×$10^{-19}$ g/cm$^3$, as shown in the graph 450. At this gas density, Sn nanoparticle deflection momentum from H2-Sn collisions is large enough to provide nearly 100% nanoparticle deflection so long as Sn momentum is no greater than 3.42×$10^{-14}$ kgm/s. Deflection of Sn nanoparticles 400 using a high density hydrogen molecular gas flow 180 maintains acceptable defect control in high volume manufacturing using the EUV lithography apparatus 10 according to some embodiments. Hydrogen gas can be vented easily without perturbation to semiconductor manufacturing operations due to low interference with the EUV light generated by the apparatus 10, and because H2 gas is already used by the source side in various embodiments.

FIG. 5A and FIG. 5B illustrate a computer system 500 for controlling the system 10 and its components in accordance with various embodiments of the present disclosure. FIG. 5A is a schematic view of a computer system 500 that controls the system 10 of FIG. 1A. In some embodiments, the computer system 500 is programmed to initiate a process for monitoring contamination levels of chamber components, wafer holding tools or airborne contamination arising from the same and provide an alert that cleaning is required. In some embodiments, manufacturing of semiconductor devices is halted in response to such an alarm. As shown in FIG. 5A, the computer system 500 is provided with a computer 501 including an optical disk read only memory (e.g., CD-ROM or DVD-ROM) drive 505 and a magnetic disk drive 506, a keyboard 502, a mouse 503 (or other similar input device), and a monitor 504.

FIG. 5B is a diagram showing an internal configuration of the computer system 500. In FIG. 5B, the computer 501 is provided with, in addition to the optical disk drive 505 and the magnetic disk drive 506, one or more processors 511, such as a micro-processor unit (MPU) or a central processing unit (CPU); a read-only memory (ROM) 512 in which a program such as a boot up program is stored; a random access memory (RAM) 513 that is connected to the processors 511 and in which a command of an application program is temporarily stored, and a temporary electronic storage area is provided; a hard disk 514 in which an application program, an operating system program, and data are stored; and a data communication bus 515 that connects the processors 511, the ROM 512, and the like. Note that the computer 501 may include a network card (not shown) for providing a connection to a computer network such as a local area network (LAN), wide area network (WAN) or any other useful computer network for communicating data used by the computer system 500 and the system 10. In various embodiments, the controller 500 communicates via wireless or hardwired connection to the system 10 and its components.

The program for causing the computer system 500 to execute the process for controlling the system 10 of FIG. 1A, and components thereof and/or to execute the process for the method of manufacturing a semiconductor device according to the embodiments disclosed herein are stored in an optical disk 521 or a magnetic disk 522, which is inserted into the optical disk drive 505 or the magnetic disk drive 506, and transmitted to the hard disk 514. Alternatively, the program is transmitted via a network (not shown) to the computer system 500 and stored in the hard disk 514. At the time of execution, the program is loaded into the RAM 513. The program is loaded from the optical disk 521 or the magnetic disk 522, or directly from a network in various embodiments.

The stored programs do not necessarily have to include, for example, an operating system (OS) or a third party program to cause the computer 501 to execute the methods disclosed herein. The program may only include a command portion to call an appropriate function (module) in a controlled mode and obtain desired results in some embodiments. In various embodiments described herein, the controller 500 is in communication with the lithography system 10 to control various functions thereof.

The controller 500 is coupled to the system 10 in various embodiments. The controller 500 is configured to provide control data to those system components and receive process and/or status data from those system components. For example, the controller 500 comprises a microprocessor, a memory (e.g., volatile or non-volatile memory), and a digital I/O port capable of generating control voltages sufficient to communicate and activate inputs to the processing system 100, as well as monitor outputs from the system 10. In addition, a program stored in the memory is utilized to control the aforementioned components of the lithography system 10 according to a process recipe. Furthermore, the controller 500 is configured to analyze the process and/or status data, to compare the process and/or status data with target process and/or status data, and to use the comparison to change a process and/or control a system component. In addition, the controller 500 is configured to analyze the process and/or status data, to compare the process and/or status data with historical process and/or status data, and to use the comparison to predict, prevent, and/or declare a fault or alarm.

Figure 6:
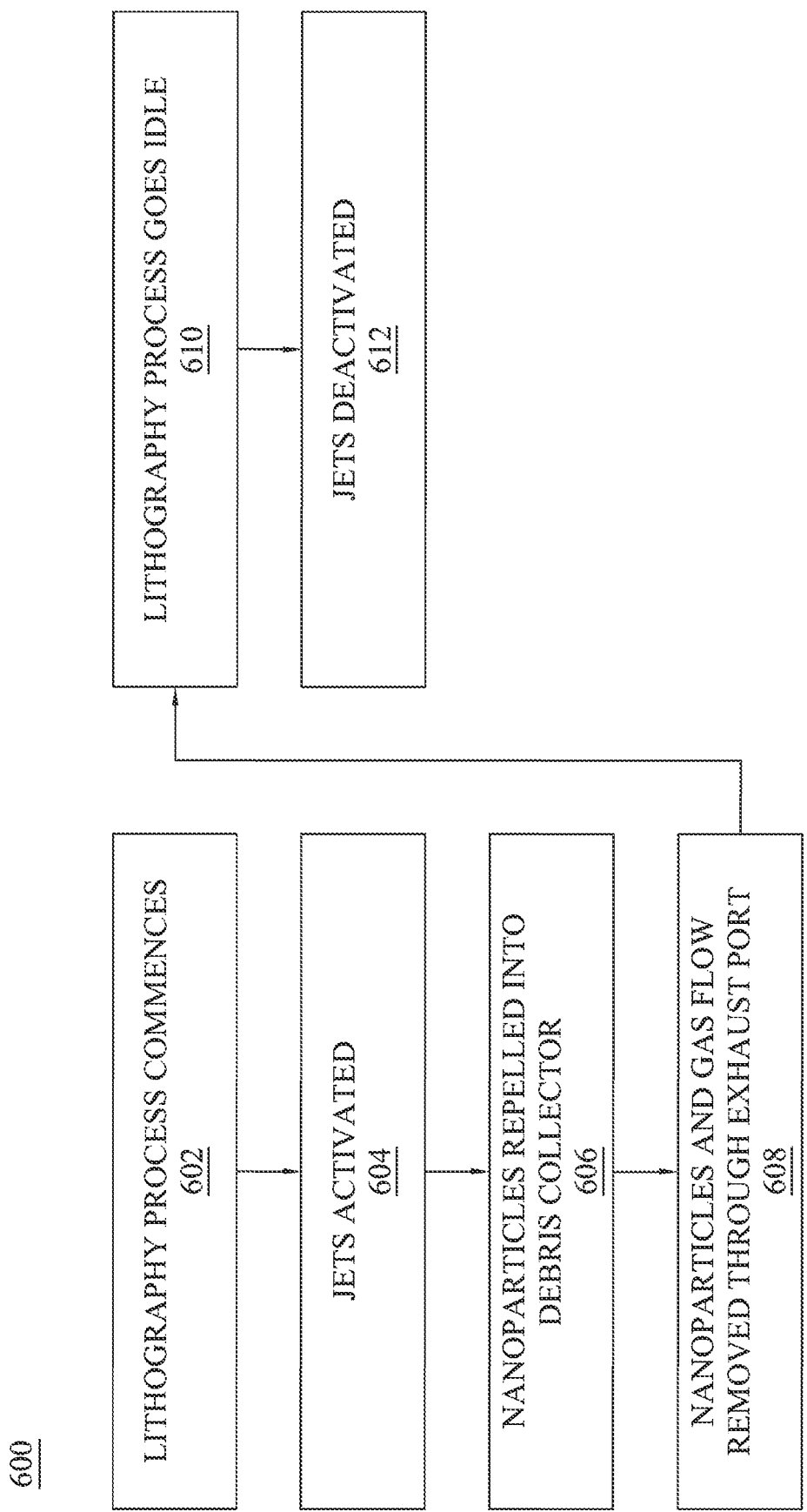
FIG. 6 is a flowchart depicting a nanoparticle mitigation process in accordance with some embodiments.

FIG. 6 is a flowchart depicting a nanoparticle mitigation process 600 in accordance with some embodiments, which in various embodiments, is performed by the controller 500. In some embodiments, when a lithography process is commenced (operation 602) by the system 10, the gas jet 170 is activated (operation 604) in order to prevent tin nanoparticle debris from migrating from the source side to the scanner side. In some embodiments, the nanoparticles 400 are deflected into a debris collector 190 by the gas flow 180 generated by the gas jet 170 (operation 606). In some embodiments, the gas jet 170 is positioned to be substantially perpendicular to the flow of nanoparticles 400 and the debris collector 190 may be disposed entirely within the scanner side of the system 10. In additional embodiments, some or all of the nanoparticles 400 are deflected back to the source side gas flow that at least partially enters the junction of the intermediate focus 160 and the supply side. In such embodiments, the nanoparticles 400 may be deflected to a debris collector 190 disposed in the source side and out of the path of generated light. In other embodiments, the deflected nanoparticles 400 and gas from the gas flow 180 are partially or completely removed through exhaust ports 140 and/or debris collection mechanisms or devices 150 disposed in the source side (operation 608). Once the lithography system 10 goes idle (operation 610), for purposes of maintenance, cleaning or whenever the semiconductor manufacturing process pauses or ends, the gas jet 170 is also deactivated (operation 612) in various embodiments.

By installing a gas jet 170 at least partially within a scanner side of the lithography system 10 and proximate to the intermediate focus 160, tin nanoparticle debris is deflected away from the reticle in the scanner side using pulsed high density supersonic hydrogen gas in various embodiments. This results in superior defect performance compared to a lithography system 10 that is not so equipped. Where the tin nanoparticles 400 have a momentum less than $3.42 \times 10^{-14}$ kgm/s, nearly 100% of the tin nanoparticles 400 are prevented from contaminating the scanner side. This solution is feasible because the gas jet 170 can be installed in-line without interfering with light generated by the source side, and only nominal additional electrical power and gas supply are required.

According to various embodiments, an extreme ultra violet (EUV) lithography method includes generating EUV light in a light source side of an EUV lithography apparatus and deflecting the nanoparticles away from the reticle by generating a gas flow using a gas jet disposed at an interface of the scanner side and the intermediate focus. In various embodiments, the apparatus includes the light source side and a scanner side. In various embodiments, EUV light and nanoparticles created during the generating EUV light pass through an intermediate focus and flow in a direction toward the scanner side and away from the light source side. In some embodiments, the gas flow is a supersonic gas flow. In some embodiments, an orientation of the gas jet is adjusted with respect to the gas flow in order to maximize deflection of the nanoparticles. In some embodiments, the gas jet is adjusted using a controller. In some embodiments, the nozzle is positioned at a fixed orientation that is substantially perpendicular to the direction away from the light source. In some embodiments, the orientation of the nozzle is between 70 degrees and 110 degrees from the direction away from the light source. In some embodiments, the nozzle is positioned at a fixed orientation that is substantially 120 degrees from the direction away from the light source. In some embodiments, the orientation of the nozzle is between 100 degrees and 140 degrees of the direction away from the light source. In some embodiments, a length of the gas flow generated by the gas jet is between one and twenty millimeters at the intermediate focus. In some embodiments, a width of the gas flow generated by the gas jet is between one and five millimeters at the intermediate focus. In some embodiments, a height of the gas flow generated by the gas jet is between one and ten millimeters at the intermediate focus. In some embodiments, the method further includes collecting the nanoparticles deflected by the gas jet using a debris collector. In some embodiments, the gas jet is disposed in the scanner side proximate to the interface such that it does not block the light.

According to various embodiments, an apparatus has a source side that generates light and nanoparticle debris, a scanner side that receives the light and directs the light to a reticle, an intermediate focus disposed at a junction of the source side and the scanner side, and a gas jet disposed between the intermediate focus and the reticle. In various embodiments, the gas jet generates a gas flow to deflect the nanoparticle debris. In some embodiments, the gas jet is disposed proximate to the intermediate focus and the gas flow occurs only in the scanner side. In some embodiments, the gas jet is disposed proximate to the intermediate focus and the gas flow at least partially occurs within the intermediate focus. In some embodiments, the gas flow is adjustable between a speed of 300 and 1200 m/s.

According to various embodiments, a method includes generating a LPP and nanoparticles in a source side, directing light from the LPP to an intermediate focus, generating a gas flow using a gas jet proximate to the intermediate focus, and deflecting nanoparticles that enter the intermediate focus using the gas flow. In some embodiments, a debris collector is disposed in the source side. In some embodiments, the gas flow is generated using a hydrogen gas. In some embodiments, the gas flow has a fixed or adjustable velocity between 300 and 1200 m/s.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultra violet (EUV) lithography method, comprising:
   receiving an EUV light by a scanner from an EUV light source, the EUV light passing through an intermediate focus disposed in the scanner and at a junction of the EUV light source and the scanner;
   directing the EUV light by the scanner to a reticle in the scanner; and
   deflecting nanoparticles from the EUV light source away from the reticle by generating a gas flow using a gas jet disposed entirely in the scanner and proximate to an interface of the scanner and the intermediate focus such that the gas jet does not block the EUV light.

2. The method of claim 1, wherein the gas flow is a supersonic gas flow.

3. The method of claim 1, further comprising adjusting an orientation of the gas jet with respect to the gas flow in order to maximize deflection of the nanoparticles.

4. The method of claim 3, wherein the orientation of the gas jet is adjusted using a controller.

5. The method of claim 1, wherein a nozzle is positioned at an orientation substantially perpendicular to a direction of the EUV light away from the EUV light source.

6. The method of claim 5, wherein the orientation of the nozzle is between 70 degrees and 110 degrees from the direction.

7. The method of claim 1, wherein a nozzle is positioned at an orientation substantially 120 degrees from a direction of the EUV light away from the EUV light source.

8. The method of claim 7, wherein the orientation of the nozzle is between 100 degrees and 140 degrees from the direction.

9. The method of claim 1, wherein a length of the gas flow generated by the gas jet is between one and twenty millimeters at the intermediate focus.

10. The method of claim 1, wherein a width of the gas flow generated by the gas jet is between one and five millimeters at the intermediate focus.

11. The method of claim 1, wherein a height of the gas flow generated by the gas jet is between one and ten millimeters at the intermediate focus.

12. The method of claim 1, further comprising collecting the nanoparticles deflected by the gas jet using a debris collector.

13. An apparatus for an extreme ultra violet (EUV) lithography, comprising:
a scanner including a reticle, wherein the scanner is configured to receive an EUV radiation from an EUV radiation source and to direct the EUV radiation to the reticle, and wherein an intermediate focus is disposed entirely in the EUV radiation source and at a junction of the EUV radiation source and the scanner; and
a gas jet disposed entirely in the scanner and adjacent to the junction of the EUV radiation source and the scanner, wherein the gas jet generates a gas flow to deflect nanoparticle debris coming from the EUV radiation source away from the reticle.

14. The apparatus of claim 13, further comprising a debris catcher to catch the deflected nanoparticle debris.

15. The apparatus of claim 13, wherein the gas jet is disposed adjacent to the intermediate focus.

16. The apparatus of claim 13, further comprising an adjustment mechanism configured to adjust a velocity of the gas flow between 300 and 1200 meters per second.

17. A method, comprising:
receiving an EUV radiation by a scanner from an EUV radiation source;
directing the EUV radiation by the scanner to an intermediate focus disposed at a junction of the EUV radiation source and the scanner; and
generating a gas flow using a gas jet, wherein the gas jet is entirely disposed in the scanner and proximate to the intermediate focus such that the gas jet deflects nanoparticles entering the intermediate focus from the EUV radiation source and does not block the EUV radiation.

18. The method of claim 17, further comprising deflecting the nanoparticles toward a debris collection device disposed in the EUV radiation source.

19. The method of claim 17, wherein the gas flow comprises a hydrogen gas having a velocity between 300 and 1200 meters per second.

20. The method of claim 17, further comprising adjusting an orientation of the gas jet with respect to the gas flow in order to maximize deflection of the nanoparticles.

* * * * *